(12) United States Patent
Ito

(10) Patent No.: US 12,130,303 B2
(45) Date of Patent: *Oct. 29, 2024

(54) MEMS DEVICE, ELECTRONIC APPARATUS, AND VEHICLE

(71) Applicant: SEIKO EPSON CORPORATION, Tokyo (JP)

(72) Inventor: Fumiya Ito, Chikuma (JP)

(73) Assignee: SEIKO EPSON CORPORATION (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/524,231

(22) Filed: Nov. 30, 2023

(65) Prior Publication Data

US 2024/0094239 A1    Mar. 21, 2024

Related U.S. Application Data

(60) Continuation of application No. 18/162,874, filed on Feb. 1, 2023, now Pat. No. 11,867,716, which is a
(Continued)

(30) Foreign Application Priority Data

Aug. 25, 2017    (JP) ................................ 2017-162015

(51) Int. Cl.
    G01P 15/135      (2006.01)
    B81B 7/00      (2006.01)
    (Continued)

(52) U.S. Cl.
    CPC .......... G01P 15/135 (2013.01); B81B 7/0016 (2013.01); G01P 15/0802 (2013.01);
    (Continued)

(58) Field of Classification Search
    CPC .......... B81B 2201/0235; B81B 7/0016; B81B 7/0019; B81B 7/0058; B81B 3/0035;
    (Continued)

(56) References Cited

U.S. PATENT DOCUMENTS 5,133,452 A    7/1992   Ohashi
5,760,354 A    6/1998   Asada
(Continued)

FOREIGN PATENT DOCUMENTS

CN      106458567 A    2/2017
JP      2014-089101 A    5/2014
(Continued)

*Primary Examiner* — John Fitzgerald
*Assistant Examiner* — Truong D Phan
(74) *Attorney, Agent, or Firm* — Harness, Dickey & Pierce, P.L.C.

(57) ABSTRACT

A MEMS device includes: a substrate as a base including a support portion and a detection electrode as a fixed electrode; a movable body supported to the support portion with a major surface of the movable body facing the fixed electrode; and an abutment portion facing at least a portion of an outer edge of the movable body and restricting rotational displacement in an in-plane direction of the major surface. The abutment portion includes an abutment surface including an abutment position at which the movable body abuts against the abutment portion due to the rotational displacement of the movable body, and a hollow portion provided opposing the abutment surface.

12 Claims, 9 Drawing Sheets

Related U.S. Application Data continuation of application No. 17/236,244, filed on Apr. 21, 2021, now Pat. No. 11,604,208, which is a division of application No. 16/111,314, filed on Aug. 24, 2018, now Pat. No. 11,061,050.

(51) Int. Cl.
*G01P 15/08* (2006.01)
*G01P 15/125* (2006.01)

(52) U.S. Cl.
CPC .... *G01P 15/125* (2013.01); *B81B 2201/0235* (2013.01); *G01P 2015/0831* (2013.01); *G01P 2015/0871* (2013.01)

(58) Field of Classification Search
CPC .. B81B 3/0097; G01P 15/0802; G01P 15/125; G01P 15/135; G01P 2015/0831; G01P 2015/0871; G01P 2015/0882
See application file for complete search history.

(56) References Cited

U.S. PATENT DOCUMENTS

| | | |
|---|---|---|
| 7,368,312 B1 | 5/2008 | Kranz et al. |
| 2010/0289480 A1 | 11/2010 | Soramoto et al. |
| 2013/0081464 A1 | 4/2013 | Park et al. |
| 2014/0031263 A1 | 1/2014 | Norling et al. |
| 2015/0013458 A1 | 1/2015 | Tanaka |
| 2015/0040667 A1 | 2/2015 | Tanaka |
| 2016/0330383 A1 | 11/2016 | Oyama |
| 2017/0023606 A1 | 1/2017 | Naumann |
| 2017/0073214 A1 | 3/2017 | Matsuoka et al. |
| 2018/0186624 A1 | 7/2018 | Hsu et al. |
| 2019/0120872 A1 | 4/2019 | Geisberger |

FOREIGN PATENT DOCUMENTS

| | | |
|---|---|---|
| JP | 2014-181922 A | 9/2014 |
| JP | 2015-017886 A | 1/2015 |
| JP | 2015-152553 A | 8/2015 |

MEMS DEVICE, ELECTRONIC APPARATUS, AND VEHICLE

CROSS-REFERENCE TO RELATED APPLICATIONS

This application is a continuation of U.S. patent application Ser. No. 18/162,874 filed on Feb. 1, 2023, which is a continuation of U.S. patent application Ser. No. 17/236,244 filed on Apr. 21, 2021, which is a divisional of U.S. patent application Ser. No. 16/111,314 filed on Aug. 24, 2018, now U.S. Pat. No. 11,061,050, issued Jul. 13, 2021, which is based on, and claims priority under 35 U.S.C. § 119 to Japanese Patent Application No. 2017-162015, filed Aug. 25, 2017, the entire disclosures of which are expressly incorporated by reference herein.

BACKGROUND

1. Technical Field

The present invention relates to a MEMS device, an electronic apparatus, and a vehicle.

2. Related Art

In the related art, a micro-electro-mechanical system (MEMS) device including a movable electrode as a movable body that is rockably supported at a support portion, and a detection electrode as a fixed electrode that is disposed at a position facing the movable body with a gap therebetween has been known as a physical quantity sensor that detects a physical quantity such as acceleration. In such a MEMS device, the movable body rocks according to a physical quantity such as acceleration applied to the MEMS device, so that the gap between the movable body and the detection electrode changes. The detection of the physical quantity such as acceleration applied to the MEMS device is performed based on the change in capacitance generated between the both electrodes according to the change in gap.

For example, JP-A-2015-17886 discloses a physical quantity sensor provided with a capacitive MEMS device including a movable electrode and a fixed electrode provided spaced apart from the movable electrode with a gap therebetween. This MEMS device is provided with a stopper for restricting the displacement of the movable electrode in a direction different from a direction in which the physical quantity is detected.

In the physical quantity sensor, however, when an excessive impact or the like is applied, a collision between the movable electrode and the stopper of the MEMS device becomes too big, which may result in the breakage of the movable electrode or the breakage of the stopper. Therefore, there is a problem in that the physical quantity may not be normally detected.

SUMMARY

An advantage of some aspects of the invention is to solve at least a part of the problems described above, and the invention can be implemented as the following modes or application examples.

APPLICATION EXAMPLE 1

A MEMS device according to this application example includes: a base including a support portion and a fixed electrode; a movable body supported to the support portion with a major surface of the movable body facing the fixed electrode; and an abutment portion facing at least a portion of an outer edge of the movable body and restricting rotational displacement in an in-plane direction of the major surface, wherein the abutment portion includes an abutment surface including an abutment position at which the movable body abuts against the abutment portion due to the rotational displacement of the movable body, and a hollow portion provided opposing the abutment surface.

According to the MEMS device according to this application example, the hollow portion is provided, corresponding to the abutment surface against which the movable body abuts, at the abutment portion including the abutment position at which the movable body abuts against the abutment portion due to the rotational displacement of the movable body in the in-plane direction. Therefore, the abutment portion has weak rigidity at a portion including the abutment surface. With this configuration, when the movable body hits against the abutment portion due to the rotational displacement, the abutment portion bends at the weak-rigidity portion. By impact absorption, in other words, by an impact buffering action due to this bending, the impact received by the movable body can be reduced, which can reduce the breakage of the movable body or the breakage of the abutment portion. The hollow portion means a portion that is made into a cavity with a through-hole (hole) or a bottomed hole (groove, recess, etc.).

APPLICATION EXAMPLE 2

In the MEMS device according to the application example, it is preferable that the abutment portion is provided facing a corner portion of the movable body.

According to this application example, the abutment portion is provided facing the corner portion where the rotational displacement of the movable body is large, and thus, when displacement in the in-plane rotational direction occurs in the movable body, it is possible to reliably restrict the displacement.

APPLICATION EXAMPLE 3

In the MEMS device according to the application example, it is preferable that a plurality of the abutment portions are provided.

According to this application example, the plurality of abutment portions against which the movable body abuts are disposed, and thus, it is possible to increase the probability of restriction on the displacement in the in-plane rotational direction occurring in the movable body.

APPLICATION EXAMPLE 4

In the MEMS device according to the application example, it is preferable that the hollow portion is opened in a surface on the side opposite to the abutment surface.

According to this application example, the abutment surface is located on the movable body side, and thus, it is possible to reliably restrict the movement of the movable body displaced while buffering an impact.

APPLICATION EXAMPLE 5

In the MEMS device according to the application example, it is preferable that the hollow portion is opened in a portion of the abutment surface.

According to this application example, the hollow portion is opened in a portion of the abutment surface, and thus, the rigidity of the abutment portion including the abutment surface, which is a portion that comes into contact with the movable body, can be reduced, which can increase a buffering action.

APPLICATION EXAMPLE 6

In the MEMS device according to the application example, it is preferable that the hollow portion is a hole provided between the abutment surface and a surface on the opposite side.

According to this application example, the hollow portion can be composed of the hole provided between the abutment surface and the surface on the opposite side. Such a hole can be easily formed in any desired shape, and therefore, the abutment portion having weak rigidity can be easily provided.

APPLICATION EXAMPLE 7

In the MEMS device according to the application example, it is preferable that the hollow portion includes a plurality of the holes.

According to this application example, the hollow portion is composed of the plurality of holes, for example, holes having a honeycomb structure, and therefore, a direction in which an impact force at the time of hitting of the movable body is transmitted is divided into a plurality of directions, which can further increase an impact absorption effect.

APPLICATION EXAMPLE 8

In the MEMS device according to the application example, it is preferable that the MEMS device further includes a wall having a gap between the movable body and the wall and provided projecting from the base along the outer edge of the movable body, and that the abutment portion is provided in a portion of the wall.

According to this application example, a portion of the wall projecting from the base along the outer edge of the movable body can be used as the abutment portion, so that the abutment portion can be space-efficiently disposed.

APPLICATION EXAMPLE 9

In the MEMS device according to the application example, it is preferable that the movable body is provided with a cavity portion, that the MEMS device further includes, in the cavity portion, a fixed portion and a suspension portion extended from the fixed portion when the movable body is viewed in a plan view, and that the movable body is suspended through the suspension portion to the fixed portion fixed to the support portion.

According to this application example, the movable body is suspended by the fixed portion through the suspension portion to the support portion, and thus, the suspension portion can function as a torsion spring, which enables the movable body to be displaced in the rotational axis direction of a support axis.

APPLICATION EXAMPLE 10

In the MEMS device according to the application example, it is preferable that the movable body and the abutment portion are made of the same material.

According to this application example, the sticking of the movable body to the abutment portion when the movable body and the abutment portion come into contact with each other can be less likely to occur.

APPLICATION EXAMPLE 11

In the MEMS device according to the application example, it is preferable that the abutment portion and the movable body are at the same potential.

According to this application example, the movable body and the abutment portion are at the same potential, so that the fluctuation and loss of a capacitance generated between the movable body and the abutment portion can be suppressed when the both portions come into contact with each other. Hence, when the movable body and the abutment portion come into contact with each other, the measurement of a physical quantity such as acceleration can be continuously performed.

APPLICATION EXAMPLE 12

An electronic apparatus according to this application example includes any of the MEMS devices described above and a control section that performs control based on a detection signal output from the MEMS device.

The electronic apparatus includes the MEMS device in which the rotational displacement of the movable body in the in-plane direction of the major surface is restricted and which can continuously detect acceleration or the like even when an excessive impact is applied, and the control section performing control based on the detection signal output from the MEMS device. Therefore, it is possible to increase the reliability of the electronic apparatus mounted with the MEMS device described above.

APPLICATION EXAMPLE 13

A vehicle according to this application example includes any of the MEMS devices described above and an attitude control section that performs attitude control based on a detection signal output from the MEMS device.

The vehicle is mounted with the MEMS device in which the rotational displacement of the movable body in the in-plane direction of the major surface is restricted and which can continuously detect acceleration or the like even when an excessive impact is applied, and the attitude control section performing attitude control based on the detection signal output from the MEMS device. Therefore, it is possible to increase the reliability of the vehicle mounted with the MEMS device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
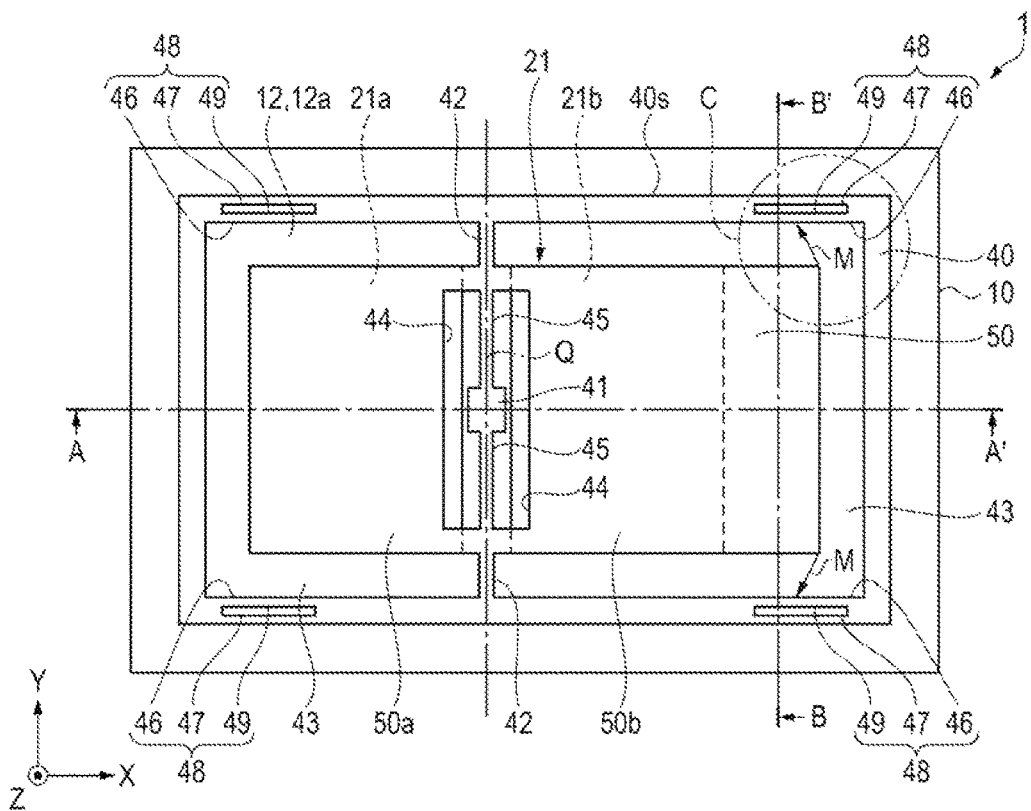
FIG. 1 is a plan view schematically showing a MEMS device according to an embodiment.

Hereinafter, embodiments of the invention will be described with reference to the drawings. In the drawings shown below, the dimensions and ratios of components may be appropriately different from those of actual components in order to show the components in sizes recognizable on the drawings.

Embodiment

Figure 2:
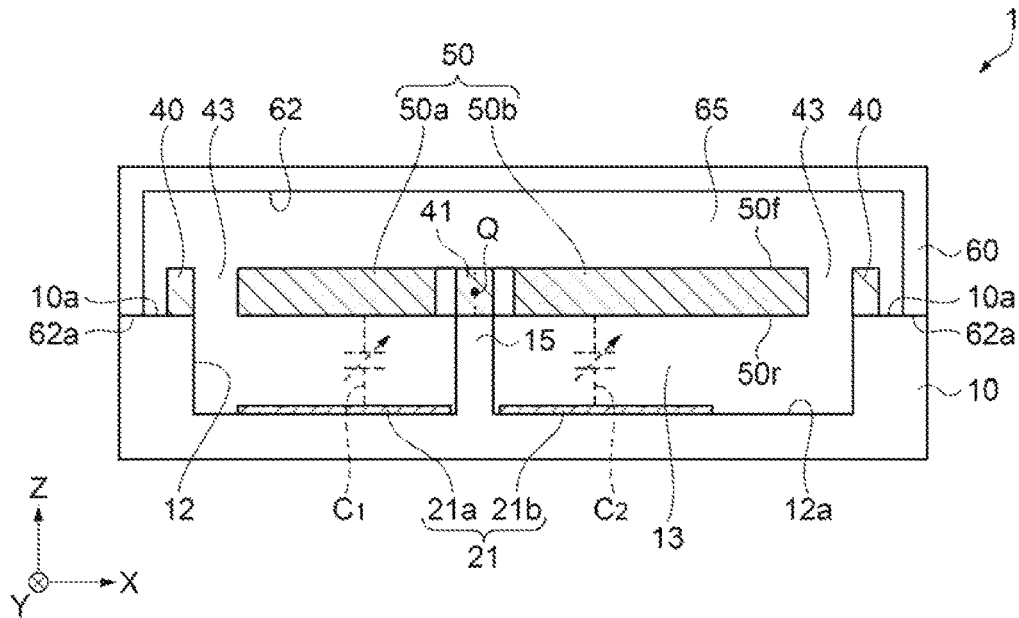
FIG. 2 is a cross-sectional view schematically showing the MEMS device according to the embodiment.
Figure 3:
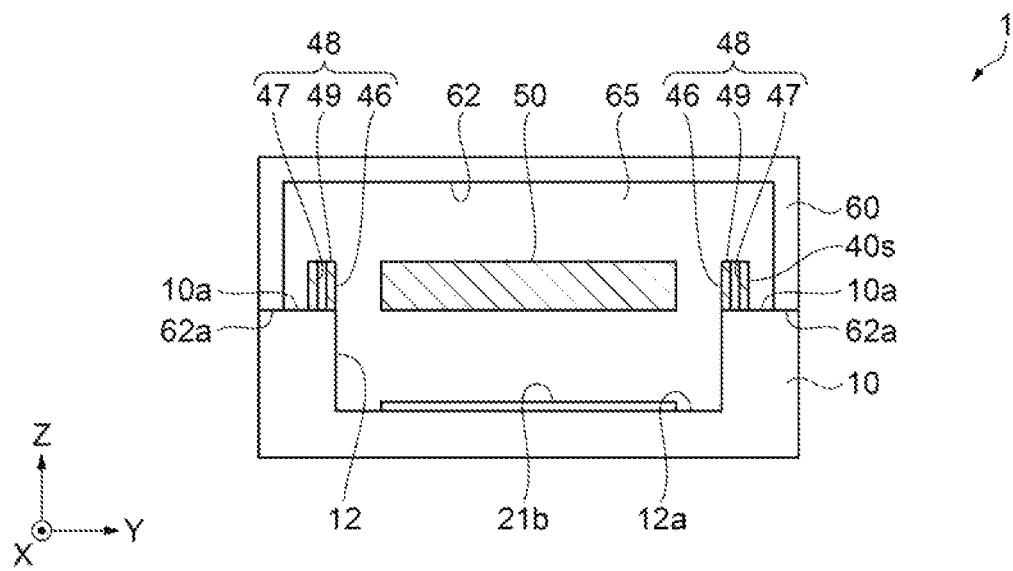
FIG. 3 is a cross-sectional view schematically showing the MEMS device according to the embodiment.

A micro-electro-mechanical system (MEMS) device according to an embodiment will be described with reference to FIGS. 1 to 3. FIG. 1 is a plan view schematically showing the MEMS device according to the embodiment. FIG. 2 is a cross-sectional view schematically showing a cross section of the MEMS device at a portion shown by line A-A' in FIG. 1. FIG. 3 is a cross-sectional view schematically showing a cross section of the MEMS device at a portion shown by line B-B' in FIG. 1. For convenience of description, a wiring portion connected to electrodes, and the like are not shown in the drawings. Moreover, a lid is not shown in FIG. 1. In the drawings, the X-axis, the Y-axis, and the Z-axis are shown as three axes orthogonal to each other. The Z-axis is an axis that indicates a thickness direction in which a substrate and the lid overlap each other. The X-axis is an axis along the arrangement direction of two detection electrodes provided on the substrate. Further, for convenience of description, in a plan view as viewed in the Z-axis direction, a surface on the +Z-axis direction side, which is the lid side, may be described as "upper surface", while a surface on the −Z-axis direction side, which is the opposite side from the +Z-axis direction side, may be described as "lower surface".

Structure of MEMS Device

The MEMS device 1 according to the embodiment can be used as, for example, an inertial sensor. Specifically, the MEMS device 1 can be used as a sensor (capacitive micro-electro-mechanical system (MEMS) acceleration sensor) for measuring the physical quantity of acceleration in the vertical direction (Z-axis direction).

As shown in FIGS. 1 to 3, the MEMS device 1 is provided with a substrate 10 as a base, a detection electrode 21 as a fixed electrode on the substrate 10, and a movable body 50 supported to a support portion 15 and a frame 40 as a wall through beams 42 and suspension portions 45 with a gap between the detection electrode 21 and the movable body 50. Further, in the MEMS device 1, a lid 60 covering the movable body 50 and the like is bonded to the substrate 10.

The substrate 10 as a base is a base material on which the frame 40, the detection electrode 21, and the like are provided. A first recessed portion 12 is provided in the substrate 10 on the side to which the lid 60 is bonded. The movable body 50 and the detection electrode 21 are contained in the first recessed portion 12 when viewed in a plan view in the Z-axis direction, which is the direction perpendicular to the substrate 10. The detection electrode 21 is provided on a first bottom surface 12a of the first recessed portion 12.

An insulating material can be used as the material of the substrate 10. In the MEMS device 1 according to the embodiment, a base material containing borosilicate glass is used as the substrate 10. In the following description, one surface of the substrate 10 in which the first recessed portion 12 is provided and to which the lid 60 to be described later is connected is referred to as "upper surface 10a".

The detection electrode 21 as a fixed electrode is provided on the first bottom surface 12a such that at least a portion of the detection electrode 21 overlaps the movable body 50 with a gap 13 between the movable body 50 and the detection electrode 21, when viewed in a plan view in the Z-axis direction, which is the direction perpendicular to the first bottom surface 12a of the substrate 10. The detection electrode 21 is configured to include a first detection electrode 21a and a second detection electrode 21b. The first detection electrode 21a and the second detection electrode 21b are electrically insulated from each other.

The detection electrode 21 is provided on both sides of the first bottom surface 12a with a support axis Q, about which the movable body 50 is inclined, as a center, when viewed in a plan view in the Z-axis direction, which is the direction perpendicular to the first bottom surface 12a. On the first bottom surface 12a, the first detection electrode 21a is provided on one of the both sides with the support axis Q as a center, while the second detection electrode 21b is provided on the other of the both sides with the support axis Q as a center. The support axis Q is an imaginary line that extends in a direction in which the beam 42 supporting the movable body 50 to be described later is extended.

The detection electrode 21 includes the first detection electrode 21a provided in the −X-axis direction shown in FIG. 1 with the support axis Q as a center and provided so as to partially overlap a first movable body 50a (the movable body 50) to be described later. Moreover, the detection electrode 21 includes the second detection electrode 21b provided in the +X-axis direction shown in FIG. 1 with the support axis Q as a center and provided so as to partially overlap a second movable body 50b (the movable body 50) to be described later. It is preferable that the surface areas of the first detection electrode 21a and the second detection electrode 21b are equal to each other. Moreover, it is preferable that the overlapping area of the first movable body 50a and the first detection electrode 21a and the overlapping area of the second movable body 50b and the second detection electrode 21b are equal to each other. This is because the magnitude or direction of the physical quantity such as acceleration applied to the MEMS device 1 is detected based on the difference between the capacitance generated between the first movable body 50a and the second movable body 50b and the capacitance generated between the first detection electrode 21a and the second detection electrode 21b.

A conductive material can be used as the material of the detection electrode 21. In the MEMS device 1 according to the embodiment, a conductive material including, for example, gold (Au), copper (Cu), aluminum (Al), indium (I), titanium (Ti), platinum (Pt), tungsten (W), tin (Sn), and silicon (Si) can be used as the material of the detection electrode 21.

The movable body 50 is provided above the first bottom surface 12a with the gap 13 between the detection electrode 21 and the movable body 50. The movable body 50 is supported to the frame 40 by the beams 42, and supported to the support portion 15 by a fixed portion 41 through the suspension portions 45.

The movable body 50 is configured to include the first movable body 50a and the second movable body 50b on both sides of the movable body 50 with the support axis Q as a center. The movable body 50 is supported through the beams 42 to the frame 40 provided on the upper surface 10a of the substrate 10, and is supported to the support portion 15 by the fixed portion 41 through the suspension portions 45. Therefore, the movable body 50 can be provided with the gap 13 between the detection electrode 21 and the movable body 50. The movable body 50 is provided spaced apart from the detection electrode 21 with the gap 13 therebetween, and therefore can be inclined (rock in a seesaw manner), with the beams 42 and the suspension portions 45 as the support axis Q, toward the first bottom surface 12a on which the detection electrode 21 is provided. A surface of the movable body 50 facing the detection electrode 21 is referred to as "major surface 50r" in the movable body 50, and a surface on the side opposite to the major surface 50r is referred to as "major surface 50f" in the movable body 50.

The movable body 50 rocks in a seesaw manner with the beam 42 as the support axis Q, so that the gap 13 (distance) between each of the first movable body 50a and the second movable body 50b and the detection electrode 21 changes. The capacitance generated between the movable body 50 and the detection electrode 21 can be changed according to the change in the gap 13 between the movable body 50 and the detection electrode 21.

When acceleration (e.g., gravitational acceleration) in the vertical direction is applied to the movable body 50, a rotation moment (moment of force) is generated in each of the first movable body 50a and the second movable body 50b. Here, when the rotation moment (e.g., a counterclockwise rotation moment) of the first movable body 50a and the rotation moment (e.g., a clockwise rotation moment) of the second movable body 50b are balanced, there is no change in the inclination of the movable body 50, and thus, the acceleration cannot be detected. Hence, the movable body 50 is provided such that when acceleration in the vertical direction is applied, the rotation moment of the first movable body 50a and the rotation moment of the second movable body 50b are not balanced and thus cause the movable body 50 to be inclined at a predetermined angle.

In the MEMS device 1, by disposing the support axis Q at a position deviated from the center (center of gravity) of the movable body 50 (by making the distances from the support axis Q to the tips of the first movable body 50a and the second movable body 50b different), the first movable body 50a and the second movable body 50b have masses different from each other. That is, the mass of the movable body 50 on one side (the first movable body 50a) is different from that on the other side (the second movable body 50b) with the support axis Q as the boundary therebetween. In the illustrated example, the distance from the support axis Q to an end surface of the first movable body 50a is smaller than the distance from the support axis Q to an end surface of the second movable body 50b. Moreover, the thickness of the first movable body 50a and the thickness of the second movable body 50b are substantially equal to each other. Hence, the mass of the first movable body 50a is smaller than the mass of the second movable body 50b. As described above, the first movable body 50a and the second movable body 50b have masses different from each other, and thus, the rotation moment of the first movable body 50a and the rotation moment of the second movable body 50b can be unbalanced when the acceleration in the vertical direction is applied. Hence, when the acceleration in the vertical direction is applied, the movable body 50 can be inclined at a predetermined angle.

A capacitance (variable capacitance) is generated between the movable body 50 and the detection electrode 21. Specifically, a capacitance (variable capacitance) C1 is configured between the first movable body 50a and the first detection electrode 21a. A capacitance (variable capacitance) C2 is configured between the second movable body 50b and the second detection electrode 21b.

The capacitances C1 and C2 change according to the gap 13 (distance) between the detection electrode 21 and the movable body 50. For example, the capacitance values of the capacitances C1 and C2 are substantially equal to each other in the state where the movable body 50 is horizontal to the substrate 10. The gap 13 (distance) between the movable body 50 and the first detection electrode 21a is equal to the gap 13 (distance) between the movable body 50 and the second detection electrode 21b, and therefore, the capacitance values of the capacitances C1 and C2 are also equal to each other.

For example, in the state where the movable body 50 is inclined with the support axis Q as a fulcrum, the capacitance values of the capacitances C1 and C2 change according to the inclination of the movable body 50. The gap 13 (distance) between the movable body 50 and the first detection electrode 21a is different from the gap 13 (distance) between the movable body 50 and the second detection electrode 21b according to the inclination of the movable body 50, and therefore, the capacitance values of the capacitances C1 and C2 are also different according to the gap 13 (distance).

The fixed portion 41 is provided inside a penetrating portion 44 as a cavity portion provided between the first movable body 50a and the second movable body 50b when the movable body 50 is viewed in a plan view. The fixed portion 41 is connected to the movable body 50 through the two suspension portions 45 extended from the fixed portion 41 on both sides thereof. In other words, the side surfaces of the fixed portion 41 and the suspension portion 45, which connect the upper and lower surfaces thereof, face the penetrating portion 44. The suspension portions 45 are provided as the support axis Q about which the movable body 50 is inclined. Moreover, the suspension portion 45 can function, together with the beam 42 to be described later, as a torsion spring and can be twisted in the rotational axis direction of the support axis Q. The fixed portion 41 is fixed to the support portion 15 projecting from the first bottom surface 12a of the substrate 10.

The beams 42 are extended toward the frame 40 from the movable body 50 at positions opposing the suspension portions 45. The beams 42 are provided as the support axis Q about which the movable body 50 is inclined. The beam 42 can function as a torsion spring and can be twisted in the rotational axis direction of the support axis Q.

The beam 42 and the suspension portion 45 function as a torsion springs as described above, so that the movable body 50 can be inclined (rock in a seesaw manner) according to a physical quantity such as acceleration. The beam 42 and the suspension portion 45 have toughness against "torsional deformation" occurring when the movable body 50 is inclined, which can suppress the breakage of the beam 42 and the suspension portion 45.

The frame 40 as a wall is provided on the upper surface 10a of the substrate 10 along the outer edge of the first recessed portion 12 in a plan view in the Z-axis direction, which is the direction perpendicular to the substrate 10. The frame 40 has a gap 43 between the movable body 50 and the frame 40, and is provided on the upper surface 10a so as to project from the upper surface 10a. The movable body 50 is supported to the frame 40 through the beams 42. The frame 40 is provided with an abutment portion 48 restricting the rotational displacement of the movable body 50 in the in-plane direction of the major surfaces 50f and 50r. The abutment portion 48 faces at least a portion of the outer edge of the movable body 50, and in the embodiment, the abutment portion 48 faces the four corners of the edge of the external form (hereinafter referred to as "outer edge") of the movable body 50) when viewed in a plan view in the Z-axis direction, which is the direction perpendicular to the substrate 10. As described above, a portion of the frame 40 projecting from the substrate 10 along the outer edge of the movable body 50 is used as the abutment portion 48, and thus, the abutment portion 48 can be space-efficiently disposed.

The abutment portion 48 is provided to restrict the displacement of the movable body 50 in the Y-axis direction crossing the Z-axis direction without disturbing the inclination of the movable body 50 in the Z-axis direction due to a physical quantity such as acceleration applied to the MEMS device 1. Moreover, the abutment portion 48 is provided also to restrict the rotational displacement of the movable body 50 in the in-plane direction of the major surfaces 50f and 50r with the Z-axis as a rotational axis. In the MEMS device 1 according to the embodiment, when the excessive displacement of the movable body 50 occurs in the Y-axis direction, the movable body 50 comes into contact with the abutment portion 48, so that the displacement is restricted. Moreover, when the rotational displacement of the movable body 50 in the in-plane direction of the major surfaces 50f and 50r occurs with the Z-axis as a rotational axis, the movable body 50 comes into contact with the abutment portion 48, so that the displacement is restricted. The arrangement of the abutment portion 48 is not particularly limited, and the abutment portion 48 can be provided along the outer edge of the movable body 50 in a direction in which the displacement of the movable body 50 is desired to be restricted.

A plurality of the abutment portions 48 are provided in the embodiment. The abutment portions 48 are provided respectively at positions facing the four corner portions of the movable body 50 having a rectangular shape. That is, the abutment portions 48 are provided at four places of the frame 40. As described above, the abutment portions 48 are provided facing the corner portions where the rotational displacement of the movable body 50 in the in-plane direction is large, and thus, it is possible to increase a restricting force against the rotational displacement in the in-plane direction occurring in the movable body 50. Moreover, the plurality of (four) abutment portions 48 are disposed, and thus, it is possible to reliably restrict the rotational displacement in the in-plane direction occurring in the movable body 50.

The abutment portion 48 includes an abutment surface 46 including an abutment position at which the movable body 50 abuts against the abutment portion 48 due to rotational displacement in the in-plane direction of the major surfaces 50f and 50r, a hollow portion 47 provided opposing the abutment surface 46, and a narrow width portion 49 formed by the hollow portion 47 and including the abutment surface 46. The in-plane direction of the major surfaces 50f and 50r of the movable body 50 in the embodiment is the rotational direction about the fixed portion 41 in a plan view in the Z-axis direction, which is the direction perpendicular to the substrate 10, and is the direction indicated by the arrow M in the drawing. The hollow portion 47 means a portion that is made into a cavity with a through-hole (hole) or a bottomed hole (groove or recess).

The hollow portion 47 in the embodiment is a penetrating portion (a portion that is made into a cavity) that is provided inside the frame 40, in other words, between the abutment surface 46 and a surface 40s on the side opposite to the abutment surface 46 and is composed of a hole penetrating the front and back sides of the frame 40 having a rectangular opening shape, in a plan view in the Z-axis direction, which is the direction perpendicular to the substrate 10. By providing the hollow portion 47 composed of such a hole, the narrow width portion 49, which is a portion having a small width dimension, is formed, and a surface of the narrow width portion 49 located on the side opposite to the hollow portion 47 side serves as the abutment surface 46. When the movable body 50 is rotationally displaced in the in-plane direction by an external impact or the like, the movable body 50 comes into contact with the abutment surface 46. The hollow portion 47 can be easily formed in any desired shape when the hollow portion 47 is composed of such a hole, and therefore, the abutment portion 48 having weak rigidity can be easily provided.

The width of the narrow width portion 49 is narrower (the wall thickness is smaller) than the width dimension of the frame 40, and the narrow width portion 49 has an elongated shape. Therefore, the narrow width portion 49 has weak rigidity in a direction from the abutment surface 46 toward the hollow portion 47 and is bendable. As described above, even when the rotational displacement of the movable body 50 is received by the narrow width portion 49 including the abutment surface 46 at the abutment portion 48 with which the movable body 50 comes into contact, an impact is absorbed by the bendable narrow width portion 49. In other words, an impact received by the movable body 50 or the abutment portion 48 can be reduced by an impact buffering action due to the bending of the narrow width portion 49, which can reduce the breakage of the movable body 50 or the breakage of the abutment portion 48.

It is preferable that the abutment portion 48 is made of the same material as the movable body 50. The abutment portion 48 is made of the same material as the movable body 50 as described above, so that the sticking of the abutment portion 48 in coming into contact with the movable body 50 can be less likely to occur.

Moreover, it is preferable that the abutment portion 48 is at the same potential as the movable body 50. The abutment portion 48 is provided as one piece integrally with the movable body 50 and the like, so that the abutment portion 48 is at the same potential as the movable body 50. The abutment portion 48 is at the same potential as the movable body 50 as described above, so that the fluctuation and loss of the capacitance generated between the movable body 50 and the abutment portion 48 can be suppressed when the abutment portion 48 comes into contact with the movable body 50. Hence, when the movable body 50 and the abutment portion 48 come into contact with each other, the measurement of a physical quantity such as acceleration can be continuously performed.

The movable body 50 has the gap 43 between the frame 40 and the movable body 50 and the gap 13 between the detection electrode 21 and the movable body 50, and therefore can rock in a seesaw manner with the beams 42 and the suspension portions 45 as the support axis Q.

In the MEMS device 1 according to the embodiment, the frame 40, the fixed portion 41, the beam 42, the suspension portion 45, and the movable body 50 can be integrally provided as one piece by patterning one base material. It is suitable to use a conductive material as the material of the movable body 50. This is because the movable body 50 functions as an electrode. Moreover, when the movable body 50 is formed as one piece integrally with the frame 40, the fixed portion 41, the beam 42, and the suspension portion 45, it is preferable to use, for example, a base material containing silicon, which is easily processed by a photolithography method.

The material of the frame 40 is not particularly limited, but various materials can be used. When the frame 40 is formed as one piece integrally with the fixed portion 41, the beam 42, the suspension portion 45, and the movable body 50, it is preferable to use, for example, a base material containing silicon, which is easily processed by a photolithography method. In this case, the hollow portion 47 can also be formed by the photolithography method.

Various materials can be used for the beam 42 without particular limitations as long as the material has toughness. When the beam 42 is formed as one piece integrally with the frame 40, the fixed portion 41, the suspension portion 45, and the movable body 50, it is preferable to use, for example, a base material containing silicon, which is easily processed by a photolithography method.

An insulating material can also be used for the frame 40, the fixed portion 41, the beam 42, the suspension portion 45, and the movable body 50. When the movable body 50 is formed of an insulating material, an electrode film may be provided on the surface of the movable body 50 facing the detection electrode 21. With this configuration, a capacitance can be generated between the detection electrode 21 and the movable body 50, and also, a change in capacitance according to a change in the gap 13 between the detection electrode 21 and the movable body 50 can be obtained with the inclination of the movable body 50 due to a physical quantity such as acceleration.

The lid 60 is provided connecting with the substrate 10. A second recessed portion 62 is provided in the lid 60. The lid 60 is connected with the upper surface 10*a* of the substrate 10 with the top surface of the second recessed portion 62 as a bonding surface 62*a*. The lid 60 is connected with the substrate 10, so that a cavity 65 that is a space surrounded by the first recessed portion 12 provided in the substrate 10 and the second recessed portion 62 provided in the lid 60 is configured in the lid 60. The movable body 50 and the like are accommodated in the cavity 65 configured by the substrate 10 and the lid 60, so that the movable body 50 and the like can be protected from an external disturbance to the MEMS device 1.

It is preferable that the second recessed portion 62 is provided, in the Z-axis direction in which the substrate 10 and the lid 60 are connected with each other, at a depth where the movable body 50 and the lid 60 do not abut against each other when the movable body 50 is inclined. Moreover, it is preferable that the second recessed portion 62 is provided deeper than the thickness of the movable body 50 in at least the Z-axis direction in which the movable body 50 is inclined. The lid 60 is grounded by a wiring line not shown in the drawing.

It is suitable to use a conductive material as the material of the lid 60. For example, a base material containing silicon, which is easily processed, is used for the lid 60 according to the embodiment. With use of the base material containing silicon for the lid 60, the lid 60 and the substrate 10 using borosilicate glass can be connected (bonded) together by an anodic bonding method.

The MEMS device 1 is provided with a wiring portion (not shown) for extracting the above-described capacitances (C1, C2) generated between the detection electrode 21 and the movable body 50 as electric signals. The capacitances generated according to the inclination of the movable body 50 can be output by the wiring portion to the outside of the MEMS device 1.

Operation of MEMS Device 1

Figure 4A:
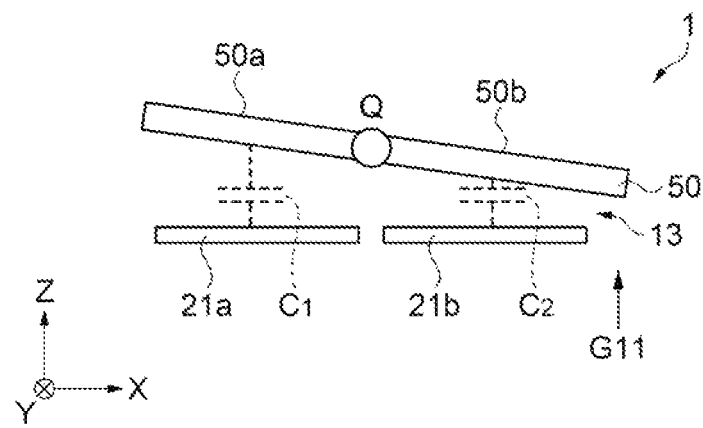
FIG. 4A is a schematic view for explaining the operation of the MEMS device according to the embodiment.
Figure 4B:
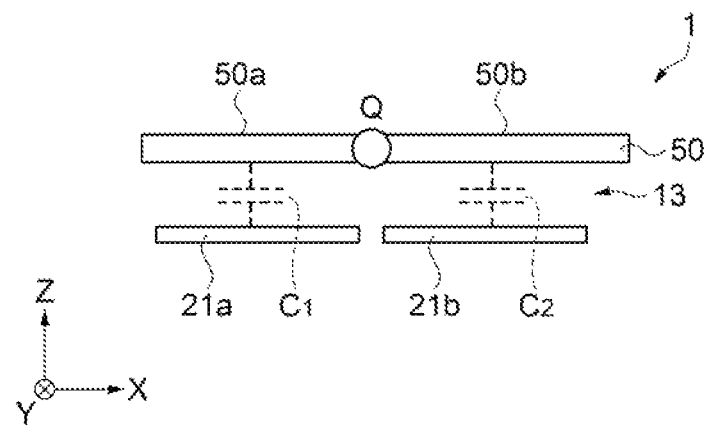
FIG. 4B is a schematic view for explaining the operation of the MEMS device according to the embodiment.
Figure 4C:
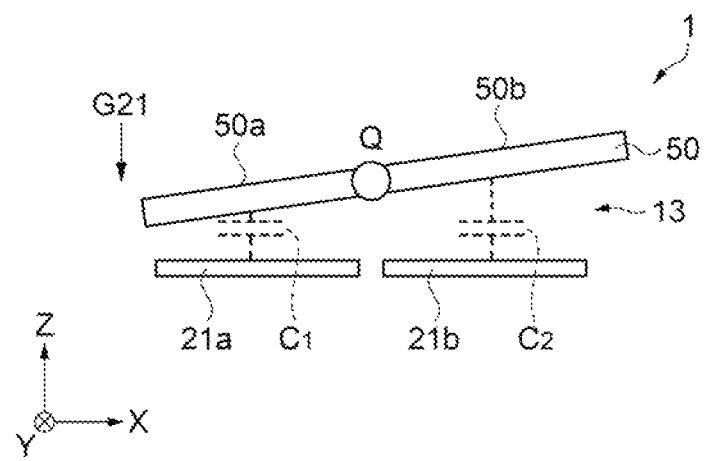
FIG. 4C is a schematic view for explaining the operation of the MEMS device according to the embodiment.

The operation of the MEMS device 1 according to the embodiment will be described with reference to FIG. 4A to 4C. FIGS. 4A, 4B, and 4C are schematic views for explaining the operation of the MEMS device according to the embodiment. In FIGS. 4A, 4B, and 4C, components other than the movable body and the detection electrode are not shown. Moreover, in FIGS. 4A, 4B, and 4C, configurations other than those of the detection electrode 21 and the movable body 50 are not shown. In the MEMS device 1 shown in FIGS. 4A, 4B, and 4C, for example when acceleration (e.g., gravitational acceleration) in the Z-axis direction is applied, a rotation moment (moment of force) about the support axis Q is generated in the movable body 50.

FIG. 4A exemplifies the state where acceleration G11 from the −Z-axis direction toward the +Z-axis direction relative to the MEMS device 1 is applied to the movable body 50. In the movable body 50 in this state, more acceleration acts on the second movable body 50*b* side than on the first movable body 50*a* side. Hence, a clockwise force with the support axis Q as a rotational axis acts on the movable body 50. Therefore, the movable body 50 (the second movable body 50*b*) is inclined to the second detection electrode 21*b* side with the support axis Q as a rotational axis.

With this configuration, the gap 13 between the second movable body 50*b* and the second detection electrode 21*b* is reduced (shortened), which increases the capacitance value of the capacitance C2 between the second movable body 50*b* and the second detection electrode 21*b*. On the other hand, the gap 13 between the first movable body 50*a* and the first detection electrode 21*a* is increased (lengthened), which reduces the capacitance value of the capacitance C1 between the first movable body 50*a* and the first detection electrode 21*a*.

FIG. 4B exemplifies the state where the acceleration is not applied to the MEMS device 1. In this state, the acceleration G11 is not applied to both the first movable body 50*a* side and the second movable body 50*b* side, and therefore, force does not act on the movable body 50. Therefore, the movable body 50 is not inclined to any of them. That is, the movable body 50 is substantially horizontal to the substrate 10.

With this configuration, the gap 13 between the first movable body 50a and the first detection electrode 21a is substantially equal to the gap 13 between the second movable body 50b and the second detection electrode 21b. Therefore, the capacitance value of the capacitance C1 between the first movable body 50a and the first detection electrode 21a is substantially equal to the capacitance value of the capacitance C2 between the second movable body 50b and the second detection electrode 21b. Moreover, the gap 13 between the first movable body 50a and the first detection electrode 21a becomes smaller than that in the state of the MEMS device 1 shown in FIG. 4A, which increases the capacitance C1 generated between the both portions. Moreover, the gap 13 between the second movable body 50b and the second detection electrode 21b is increased, which reduces the capacitance C2 generated between the both portions.

FIG. 4C exemplifies the state where acceleration G21 from the +Z-axis direction toward the −Z-axis direction relative to the MEMS device 1 is applied to the movable body 50. In the movable body 50 in this state, the acceleration G21 is applied to the first movable body 50a side, and therefore, a counterclockwise force with the support axis Q as a rotational axis acts on the movable body 50. Therefore, the movable body 50 is inclined to the first detection electrode 21a side. FIG. 4C shows the state where the acceleration G21 is greater than the gravitational acceleration acting on the second movable body 50b. Therefore, the movable body 50 is inclined to the first detection electrode 21a side.

With this configuration, the gap 13 between the first movable body 50a and the first detection electrode 21a is reduced (shortened), which increases the capacitance value of the capacitance C1 between the first movable body 50a and the first detection electrode 21a. On the other hand, the gap 13 between the second movable body 50b and the second detection electrode 21b is increased (lengthened), which reduces the capacitance value of the capacitance C2 between the second movable body 50b and the second detection electrode 21b. Moreover, the gap 13 between the first movable body 50a and the first detection electrode 21a becomes smaller than that in the state where the acceleration is not applied to the MEMS device 1 shown in FIG. 4B, which increases the capacitance C1 generated between the both portions. Moreover, the gap 13 between the second movable body 50b and the second detection electrode 21b is increased, which reduces the capacitance value of the capacitance C2 generated between the both portions.

The MEMS device 1 according to the embodiment can detect the value of the acceleration (e.g., G11, G21) from the changes in two capacitance values. For example, the acting direction and force of the acceleration G11 can be detected by determining the changes in capacitance values in the state of FIG. 4A based on the capacitance values obtained in the state of FIG. 4B. Moreover, the acting direction and force of the acceleration G21 can be detected by determining the changes in capacitance values in the state of FIG. 4C.

According to the MEMS device 1 according to the embodiment described above, the hollow portion 47 is provided, corresponding to the abutment surface 46 against which the movable body 50 abuts, at the abutment portion 48 including the abutment position at which the movable body 50 abuts against the abutment portion 48 due to the rotational displacement of the movable body 50 in the in-plane direction of the major surfaces 50f and 50r, and thus, the abutment portion 48 has weak rigidity at a portion (the narrow width portion 49) including the abutment surface 46. With this configuration, when the movable body 50 hits against the abutment portion 48 due to the rotational displacement, the abutment portion bends at the narrow width portion 49, which is a weak rigidity portion. By impact absorption, in other words, an impact buffering action due to this bending, an impact between the movable body 50 and the abutment portion 48 can be reduced, which can reduce the breakage of the movable body 50 or the breakage of the abutment portion 48.

In the above description, an example in which the movable body 50 is fixed to the substrate 10 through two portions, the fixed portion 41 and the frame 40, has been shown and described. However, the fixing of the movable body 50 to the substrate 10 can be performed through a configuration with one portion using, for example, the fixed portion 41.

MODIFIED EXAMPLES OF ABUTMENT PORTION

In the embodiment described above, the abutment portion 48 provided in the frame 40 has been exemplified and described. However, the configuration of the abutment portion is not limited to this example and can be configured as shown in the following modified examples. Hereinafter, the configurations of Modified Example 1 to Modified Example 6 will be successively described according to FIGS. 5 to 10. In the following description, configurations similar to those in the embodiment described above are denoted by the same reference numerals and signs, and a detailed description of the configurations may be omitted.

Modified Example 1

Figure 5:
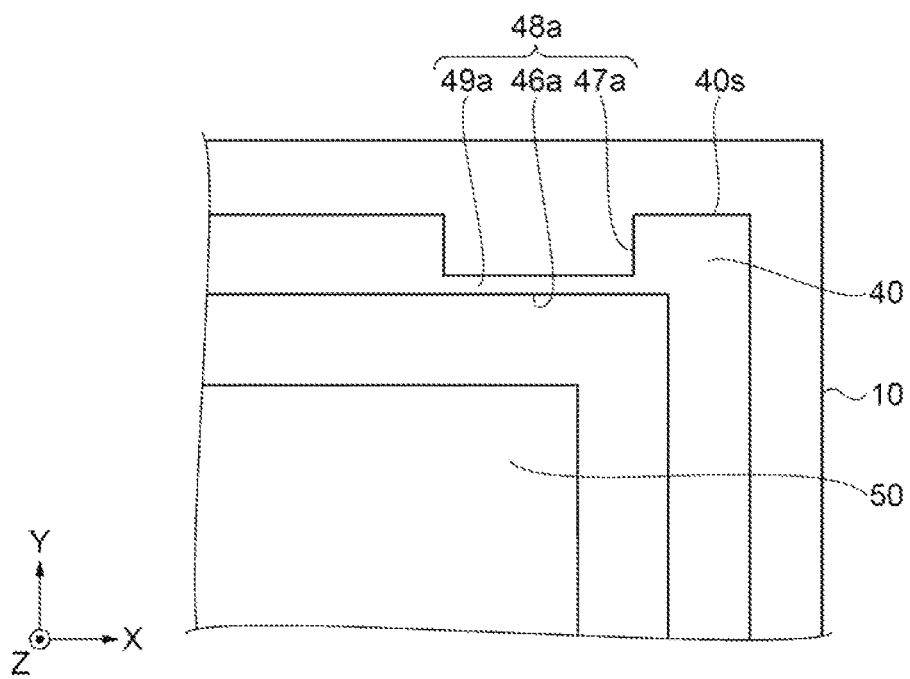
FIG. 5 is a plan view schematically showing Modified Example 1 of an abutment portion.

First, with reference to FIG. 5, Modified Example 1 of an abutment portion will be described. FIG. 5 is a plan view schematically showing Modified Example 1 of the abutment portion, showing in an enlarged manner a portion corresponding to the part C in FIG. 1.

The abutment portion 48a according to Modified Example 1 shown in FIG. 5 includes an abutment surface 46a including an abutment position at which the movable body 50 abuts against the abutment portion 48a due to rotational displacement in the in-plane direction, a hollow portion 47a provided opposing the abutment surface 46a, and a narrow width portion 49a formed by the hollow portion 47a and including the abutment surface 46a. In the abutment portion 48a according to Modified Example 1, the hollow portion 47a is composed of a penetrating portion (cutout portion) that is opened in the surface 40s on the side opposite to the abutment surface 46a in the frame 40.

According to the abutment portion 48a according to Modified Example 1, the abutment surface 46a is provided on the movable body 50 side, and therefore, it is possible to reliably restrict the movement of the movable body 50 while buffering an impact of the movable body 50 displaced. Moreover, the hollow portion 47a is opened in the surface 40s on the side opposite to the abutment surface 46a, and therefore, the narrow width portion 49a can be easily formed.

Modified Example 2

Figure 6:
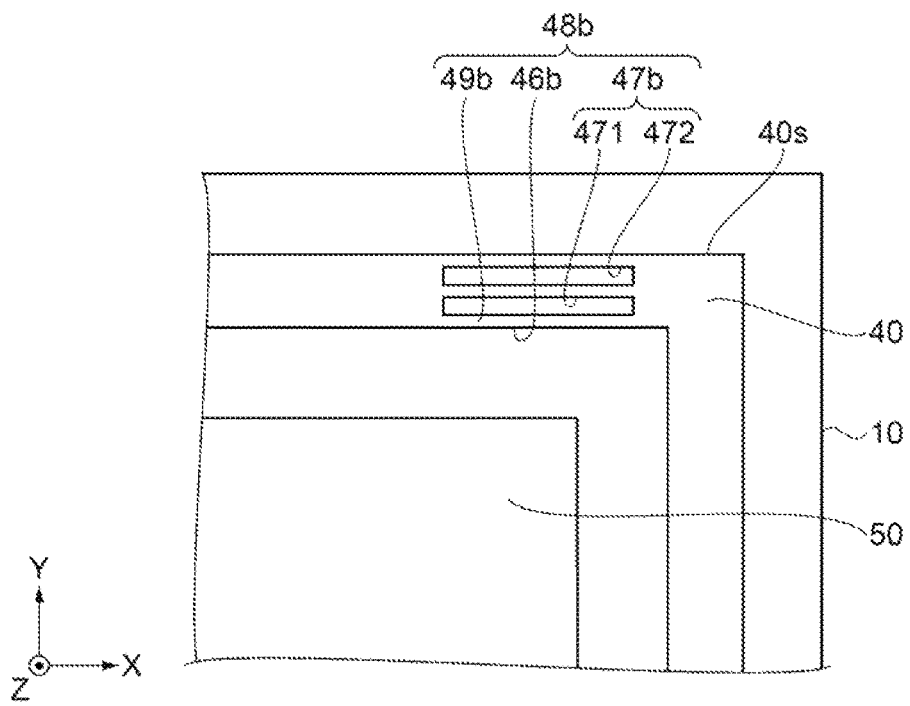
FIG. 6 is a plan view schematically showing Modified Example 2 of an abutment portion.

With reference to FIG. 6, Modified Example 2 of an abutment portion will be described. FIG. 6 is a plan view schematically showing Modified Example 2 of the abutment portion, showing in an enlarged manner a portion corresponding to the part C in FIG. 1.

The abutment portion 48b according to Modified Example 2 shown in FIG. 6 includes an abutment surface 46b including an abutment position at which the movable body 50 abuts against the abutment portion 48b due to rotational displacement in the in-plane direction, a hollow portion 47b composed of two holes 471 and 472 provided opposing the abutment surface 46b, and a narrow width portion 49b formed by the hole 471 constituting the hollow portion 47b and including the abutment surface 46b. In the abutment portion 48b according to Modified Example 2, the hollow portion 47b is composed of two penetrating portions (the holes 471 and 472 having a rectangular shape) that penetrate the frame 40 from a surface thereof on the +Z-axis direction side, which is the lid 60 (see FIG. 2) side, to a surface on the opposite side.

According to the abutment portion 48b according to Modified Example 2, the hollow portion 47b is composed of the plurality of holes 471 and 472, and therefore, a direction in which an impact force at the time of hitting of the movable body 50 is transmitted is divided into a plurality of directions, which can further increase an impact absorption effect.

Modified Example 3

Figure 7:
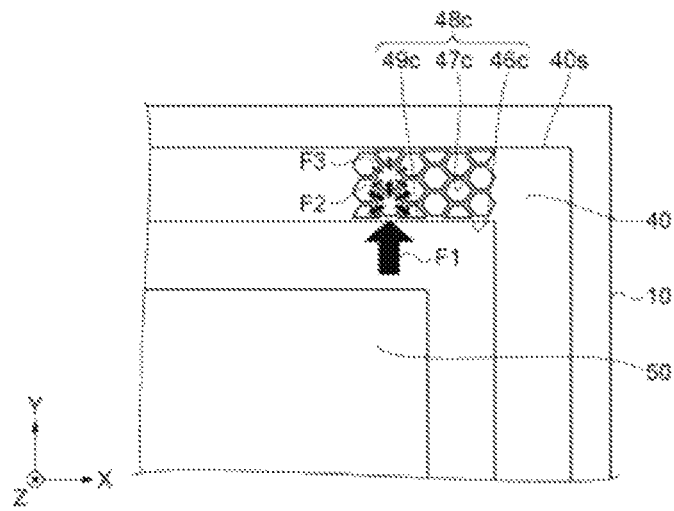
FIG. 7 is a plan view schematically showing Modified Example 3 of an abutment portion.

With reference to FIG. 7, Modified Example 3 of an abutment portion will be described. FIG. 7 is a plan view schematically showing Modified Example 3 of the abutment portion, showing in an enlarged manner a portion corresponding to the part C in FIG. 1.

The abutment portion 48c according to Modified Example 3 shown in FIG. 7 includes an abutment surface 46c including an abutment position at which the movable body 50 abuts against the abutment portion 48c due to rotational displacement in the in-plane direction, a hollow portion 47c provided opposing the abutment surface 46c, and a narrow width portion 49c formed by the hollow portion 47c and including the abutment surface 46c. In the abutment portion 48c according to Modified Example 3, the hollow portion 47c is composed of penetrating portions (holes) that are arranged in a so-called honeycomb structure in which a plurality of holes having a hexagonal outer edge and opened in the surface 40s on the side opposite to the abutment surface 46c in the frame 40 are continuously arranged regularly.

According to the abutment portion 48c according to Modified Example 3, the hollow portion 47c is composed of the plurality of holes constituting the honeycomb structure, and therefore, a direction in which an impact force F1 at the time of hitting of the movable body 50 is transmitted is divided into a plurality of directions as shown by the arrows F2 and F3 in the drawing, which can further increase an impact absorption effect.

Modified Example 4

Figure 8:
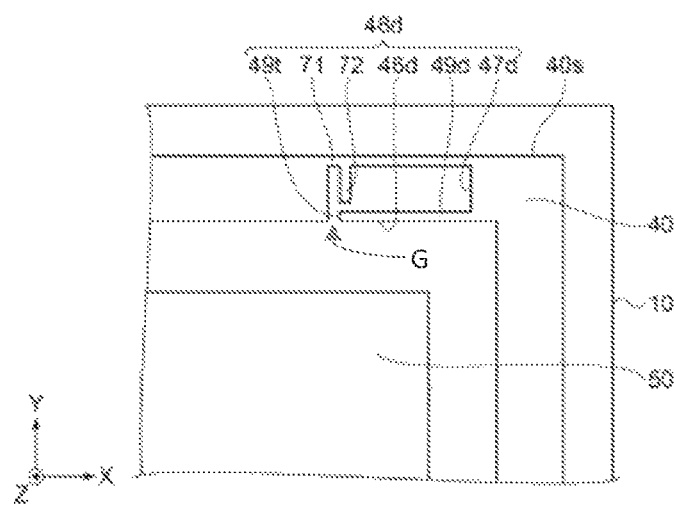
FIG. 8 is a plan view schematically showing Modified Example 4 of an abutment portion.

With reference to FIG. 8, Modified Example 4 of an abutment portion will be described. FIG. 8 is a plan view schematically showing Modified Example 4 of the abutment portion, showing in an enlarged manner a portion corresponding to the part C in FIG. 1.

The abutment portion 48d according to Modified Example 4 shown in FIG. 8 includes an abutment surface 46d including an abutment position at which the movable body 50 abuts against the abutment portion 48d due to rotational displacement in the in-plane direction, a hollow portion 47d provided opposing the abutment surface 46d, and a narrow width portion 49d formed by the hollow portion 47d and including the abutment surface 46d. In the abutment portion 48d according to Modified Example 4, the hollow portion 47d is composed of a penetrating portion (hole) that is opened in a portion of the abutment surface 46d in the frame 40.

This will be described in further detail. The narrow width portion 49d of the abutment portion 48d has a so-called cantilever shape in which the narrow width portion 49d extends from the frame 40 and includes a tip (open end) 49t at a position at which the narrow width portion 49d has a gap "G" between the narrow width portion 49d and the frame 40 that the narrow width portion 49d faces in the extending direction. In other words, the hollow portion 47d is opened, and the abutment surface 46d is cut, between the tip 49t of the narrow width portion 49d and the frame 40 that the narrow width portion 49d faces in the extending direction thereof. In addition, a projecting portion 72 is provided at a position facing the tip 49t of the narrow width portion 49d on the hollow portion 47d side. The projecting portion 72 extends in an elongated manner toward the narrow width portion 49d from an edge 71 on the surface 40s side of the frame 40 on the side opposite to the abutment surface 46d and has a gap between the narrow width portion 49d and the projecting portion 72.

According to the abutment portion 48d according to Modified Example 4, the hollow portion 47d is opened in a portion of the abutment surface 46d, and thus, the rigidity of the narrow width portion 49d including the abutment surface 46d, which is a portion that comes into contact with the movable body 50, can be further reduced, which can further increase a buffering action on the contact with the movable body 50. Moreover, the projecting portion 72 can be used as a stopper for the narrow width portion 49d, and therefore, excessive deformation of the narrow width portion 49d can be suppressed, which can suppress the breakdown of the narrow width portion 49d.

Modified Example 5

Figure 9:
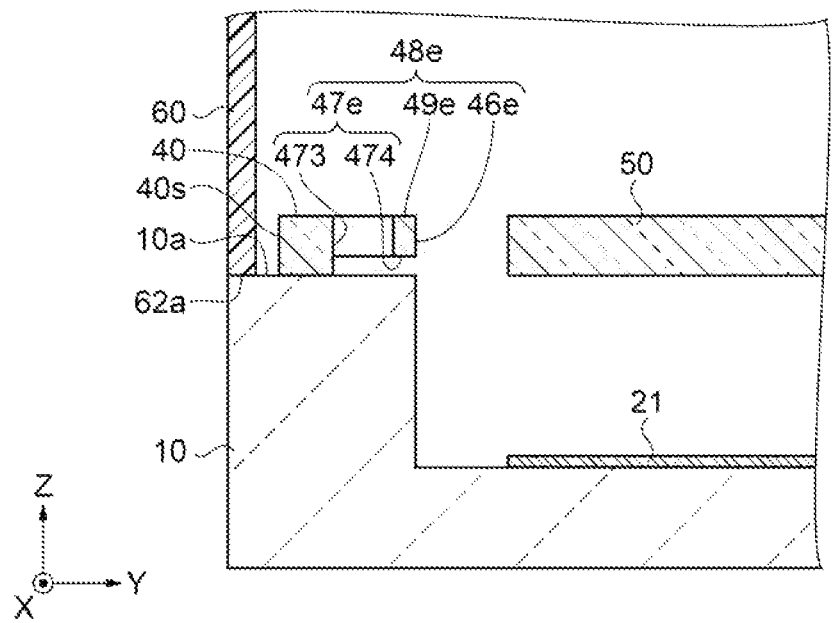
FIG. 9 is a cross-sectional view schematically showing Modified Example 5 of an abutment portion.

With reference to FIG. 9, Modified Example 5 of an abutment portion will be described. FIG. 9 is a cross-sectional view schematically showing Modified Example 5 of the abutment portion.

The abutment portion 48e according to Modified Example 5 shown in FIG. 9 includes an abutment surface 46e including an abutment position at which the movable body 50 abuts against the abutment portion 48e due to rotational displacement in the in-plane direction, a hollow portion 47e provided opposing the abutment surface 46e, and a narrow width portion 49e formed by the hollow portion 47e and including the abutment surface 46e. The hollow portion 47e is composed of a penetrating portion 473 and a recessed portion 474. The penetrating portion 473 penetrates the frame 40 from a surface thereof on the +Z-axis direction side, which is the lid 60 (see FIG. 2) side, to a surface on the opposite side. The recessed portion 474 is recessed in a groove shape from the substrate 10 side of the abutment portion 48e, and forms a cavity whose one end is opened in the abutment surface 46e and whose other end is opened in the penetrating portion 473.

According to the abutment portion 48e according to Modified Example 5, the recessed portion 474 is provided in the abutment portion 48e, and thus, the width and also height (a thickness that is a dimension in the Z-axis direction) of the narrow width portion 49e including the abutment surface 46e are reduced, which can further weaken the rigidity of the narrow width portion 49e. With this configuration, a buffering action is increased because the narrow width portion 49e becomes more bendable, which can facilitate the absorption of an impact caused by the hitting of the movable body 50 and the abutment portion 48e.

Modified Example 6

Figure 10:
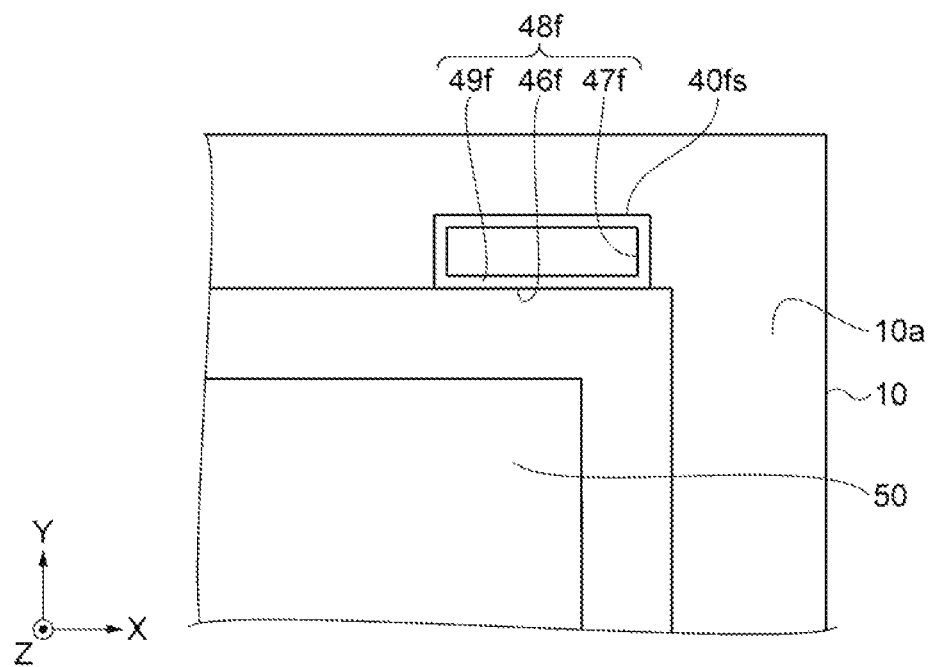
FIG. 10 is a plan view schematically showing Modified Example 6 of an abutment portion.

With reference to FIG. 10, Modified Example 6 of an abutment portion will be described. FIG. 6 is a plan view schematically showing Modified Example 6 of the abutment portion, showing in an enlarged manner a portion corresponding to the part C in FIG. 1. In the embodiment and modified examples described above, a configuration in which any of the abutment portion 48 and the abutment portions 48a to 48e is provided in the frame 40 has been described. However, Modified Example 6 represents a configuration example in which the abutment portions are not disposed in the frame 40 but disposed individually.

The abutment portion 48f according to Modified Example 6 shown in FIG. 10 is provided, at four places, as an individual stopper including an abutment position at which the movable body 50 abuts against the abutment portion 48f due to rotational displacement in the in-plane direction. FIG. 10 representatively shows one place. The abutment portion 48f has a substantially rectangular shape in a plan view in the normal direction (+Z-axis direction) of the major surfaces 50f and 50r of the movable body 50, and is connected to the upper surface 10a of the substrate 10. The abutment portion 48f includes an abutment surface 46f including the abutment position at which the movable body 50 abuts against the abutment portion 48f due to rotational displacement in the in-plane direction, a hollow portion 47f provided opposing the abutment surface 46f, and a narrow width portion 49f formed by the hollow portion 47f and including the abutment surface 46f. In the abutment portion 48f according to Modified Example 6, the hollow portion 47f is composed of a penetrating portion (hole) that is provided between the abutment surface 46f and a surface 40fs on the side opposite to the abutment surface 46f and has a substantially rectangular shape in the plan view.

Also in the abutment portion 48f according to Modified Example 6, similarly to the abutment portion 48 provided in the frame 40 according to the embodiment, the rigidity of the abutment portion 48f is weakened by the narrow width portion 49f formed by providing the hollow portion 47f corresponding to the abutment surface 46f including the abutment position at which the movable body 50 abuts against the abutment portion 48f due to rotational displacement. With this configuration, when the movable body 50 hits against the abutment portion 48f due to rotational displacement, the narrow width portion 49f having weak rigidity bends. By an impact buffering action due to this bending, an impact between the movable body 50 and the abutment portion 48f can be reduced, which can reduce the breakage of the movable body 50 or the breakage of the abutment portion 48f.

Electronic Apparatuses

Electronic apparatuses to which any of the MEMS device 1 according to an embodiment of the invention and the modified examples of the MEMS device 1 is applied will be described with reference to FIGS. 11 to 14. Hereinafter, the MEMS device 1 and the modified examples thereof are collectively described as "MEMS device 1".

Figure 11:
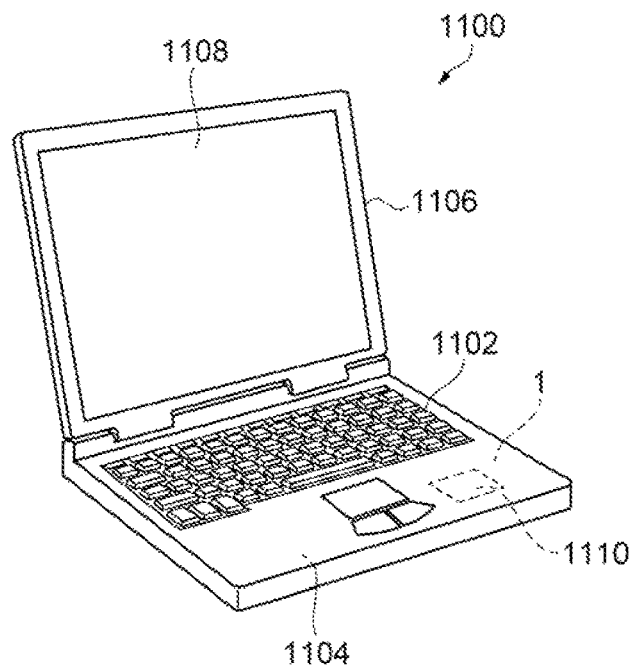
FIG. 11 is a diagram schematically showing a personal computer as an electronic apparatus according to an embodiment.

FIG. 11 is a perspective view showing an outline of the configuration of a laptop (or mobile) personal computer as an electronic apparatus including the MEMS device 1 according to an embodiment of the invention. In this drawing, the laptop personal computer 1100 is composed of a main body section 1104 including a keyboard 1102, and a display unit 1106 including a display section 1108. The display unit 1106 is rotatably supported relative to the main body section 1104 through a hinge structure portion. The capacitive MEMS device 1 functioning as an acceleration sensor or the like for detecting acceleration or the like applied to the laptop personal computer 1100 and displaying the acceleration or the like on the display unit 1106 is incorporated into the laptop personal computer 1100, and a control section 1110 can perform control such as, for example, attitude control based on detection data of the MEMS device 1. The MEMS device 1 used herein has an improved impact resistance and therefore can continuously detect acceleration or the like even when excessive acceleration or the like is applied due to falling or the like of the laptop personal computer 1100. Therefore, the laptop personal computer 1100 with high reliability can be obtained due to the above-described MEMS device 1 mounted therein.

Figure 12:
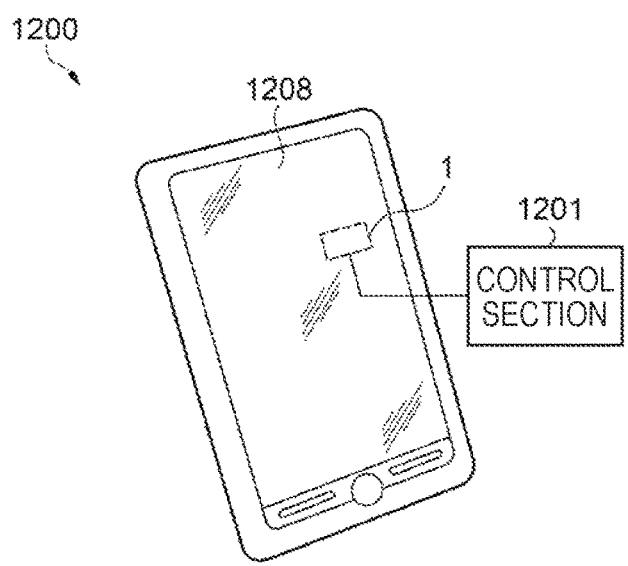
FIG. 12 is a diagram schematically showing a mobile phone as an electronic apparatus according to an embodiment.

FIG. 12 is a perspective view schematically showing the configuration of a smartphone (mobile phone) as one example of an electronic apparatus.

In this drawing, the MEMS device 1 described above is incorporated into the smartphone 1200. Detection data (acceleration data) detected by the MEMS device 1 is transmitted to a control section 1201 of the smartphone 1200. The control section 1201 is configured to include a central processing unit (CPU). The control section 1201 recognizes the attitude or behavior of the smartphone 1200 from the received detection data, and can change a display image displayed on a display section 1208, produce a warning beep or a sound effect, or drive a vibration motor to vibrate a main body. In other words, the control section 1201 performs motion sensing of the smartphone 1200, and can change display contents or produce sounds, vibrations, or the like from the measured attitude or behavior. Especially when a game application is executed, a user can experience a sense of realism close to reality. The MEMS device 1 used herein has an improved impact resistance and therefore can continuously detect acceleration or the like even when excessive acceleration or the like is applied due to falling or the like of the smartphone 1200. Therefore, the smartphone 1200 with high reliability can be obtained due to the above-described MEMS device 1 mounted therein.

Figure 13:
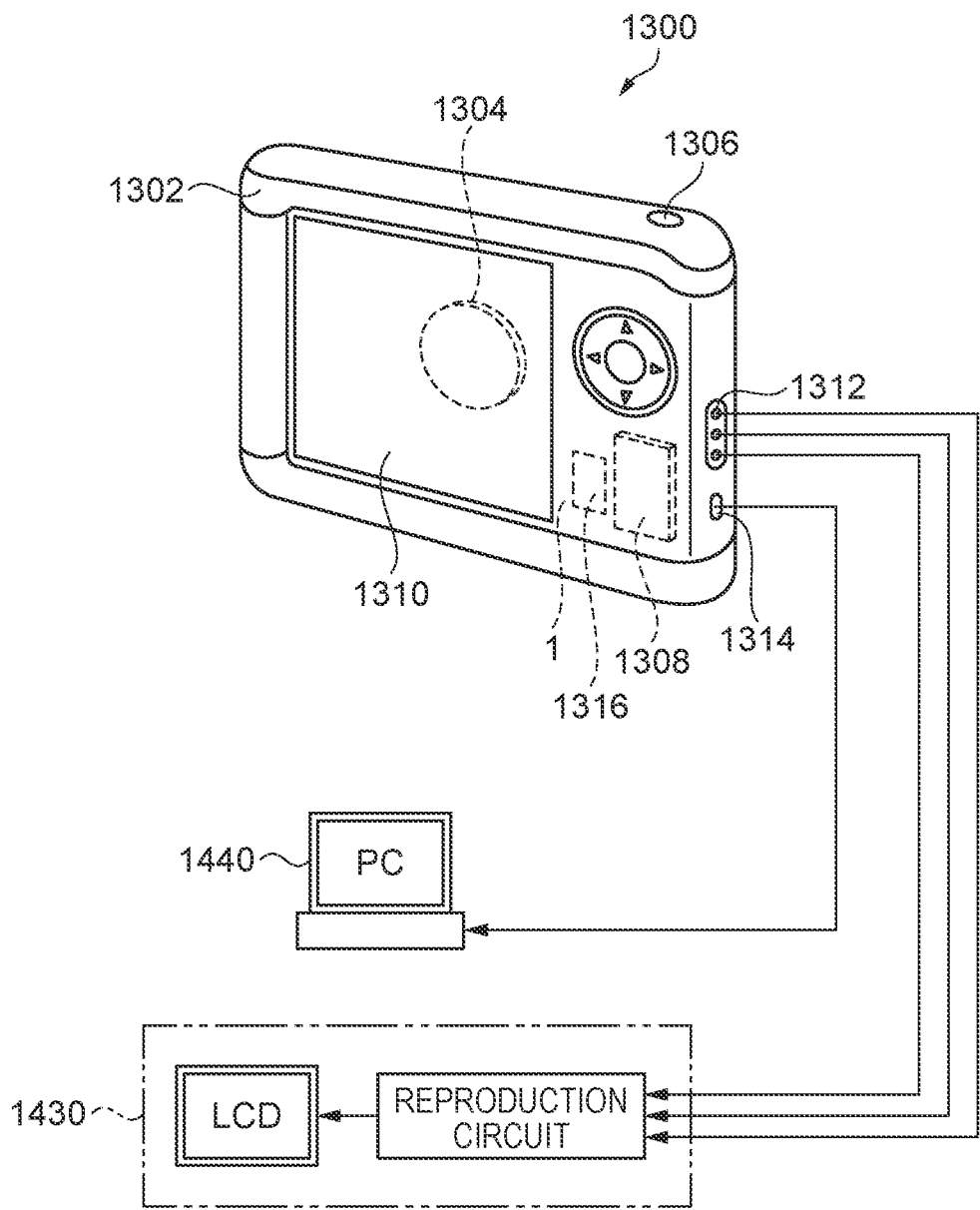
FIG. 13 is a diagram schematically showing a digital still camera as an electronic apparatus according to an embodiment.

FIG. 13 is a perspective view showing the configuration of a digital still camera as one example of an electronic apparatus. In this drawing, connections with external apparatuses are also shown in a simplified manner.

A display section 1310 is provided on the back side of a case (body) 1302 of the digital still camera 1300, and configured to perform display based on an imaging signal generated by a CCD. The display section 1310 functions as a finder that displays a subject as an electronic image. Moreover, on the front side (the rear side in the drawing) of the case 1302, a light receiving unit 1304 including an optical lens (imaging optical system) and the CCD is provided.

When a photographer confirms the subject image displayed on the display section 1310 and presses down a shutter button 1306, an imaging signal of the CCD at the time is transferred to and stored in a memory 1308. Moreover, in the digital still camera 1300, a video signal output terminal 1312 and a data communication input/output terminal 1314 are provided on a side surface of the case 1302. In addition, as shown in the drawing, a television monitor 1430 and a personal computer 1440 are connected as necessary to the video signal output terminal 1312 and the data communication input/output terminal 1314, respectively. Further, the imaging signal stored in the memory 1308 is output to the television monitor 1430 or the personal computer 1440 by a predetermined operation. The MEMS device 1 functioning as an acceleration sensor is incorporated into the digital still camera 1300, and a control section 1316 can perform control such as, for example, a camera shake correction based on the detection data of the MEMS device 1. The MEMS device 1 used herein has an improved impact resistance and therefore can continuously detect acceleration or the like even when excessive acceleration or the like is applied due to falling or the like of the digital still camera 1300. Therefore, the digital still camera 1300 with high reliability can be obtained due to the above-described MEMS device 1 mounted therein.

In addition to the personal computer 1100 in FIG. 11, the smartphone 1200 (mobile phone) in FIG. 12, and the digital still camera 1300 in FIG. 13, an electronic apparatus including the MEMS device 1 can be applied to, for example, a tablet terminal, a timepiece, an inkjet ejection apparatus (e.g., an inkjet printer), a laptop personal computer, a television set, a video camcorder, a video tape recorder, a car navigation system, a pager, an electronic notebook (including one with communication function), an electronic dictionary, a calculator, an electronic gaming machine, a word processors, a workstation, a videophone, a surveillance television monitor, electronic binoculars, a POS terminal, a medical apparatus (e.g., an electronic thermometer, a sphygmomanometer, a blood glucose meter, an electrocardiogram measuring system, an ultrasonic diagnosis apparatus, and an electronic endoscope), a fishfinder, various types of measuring instrument, gauges (e.g., gauges used in a vehicle, aircraft, and a ship), a flight simulator, a seismometer, a pedometer, an angle meter, a vibrometer to measure vibration of a hard disk, an attitude control device for a robot or an air vehicle such as a drone, a control apparatus used in inertial navigation for automatic driving of an automobile, and the like.

Vehicle

Figure 14:
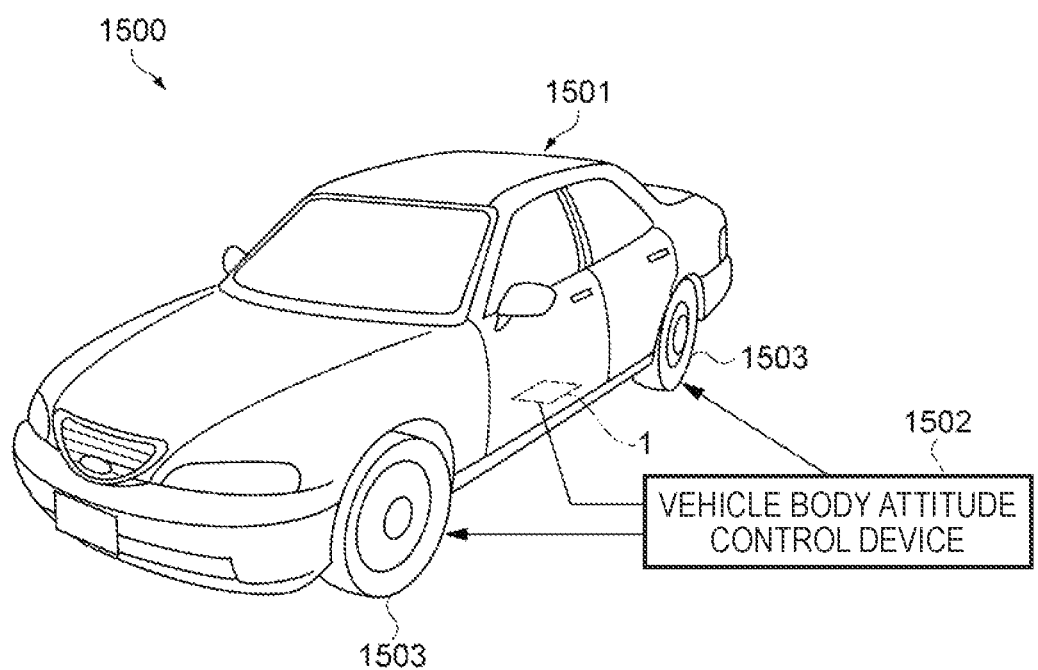
FIG. 14 is a diagram schematically showing an automobile as a vehicle according to an embodiment.

Next, as a representative example of a vehicle to which any of the MEMS device 1 according to an embodiment of the invention and the modified examples of the MEMS device 1 is applied, an example of using the MEMS device 1 is shown in FIG. 14 and will be described in detail. FIG. 14 is a perspective view showing the configuration of an automobile as one example of the vehicle.

As shown in FIG. 14, the MEMS device 1 is incorporated into the automobile 1500. For example, the attitude of a vehicle body 1501 can be detected by the MEMS device 1. A detection signal of the MEMS device 1 is supplied to a vehicle body attitude control device 1502 as an attitude control section. The vehicle body attitude control device 1502 detects the attitude of the vehicle body 1501 based on the signal, and can control the hardness and softness of a suspension or control a brake of each wheel 1503 according to a result of the detection. In addition, the MEMS device 1 can be widely applied to a keyless entry system, an immobilizer, a car navigation system, a car air-conditioner, an anti-lock brake system (ABS), an air bag, a tire pressure monitoring system (TPMS), engine control, a control apparatus for inertial navigation for automatic driving, an electronic control section (ECU) of a battery monitor or the like of a hybrid automobile or an electric automobile.

In addition to the above examples, the MEMS device 1 applied to a vehicle can be used for, for example, the attitude control of a bipedal walking robot or an electric train, the attitude control of a remote-control or autonomous air vehicle such as a radio-controlled airplane, a radio-controlled helicopter, and a drone, and the attitude control of an agricultural machine, a construction machine, and the like. As described above, the MEMS device 1 and each control section (not shown) are incorporated for realizing the attitude control of various vehicles.

The vehicle includes the MEMS device 1 having an improved impact resistance, and the vehicle body attitude control device 1502 as a control section, and therefore has excellent reliability such that, for example, acceleration or the like can be continuously detected even when an excessive impact or the like is applied.

The MEMS device, the electronic apparatus, and the vehicle have been described so far based on the embodiment shown in the drawings. However, the invention is not limited thereto, and the configuration of each portion can be replaced with any configuration having a similar function. Moreover, any other configurations may be added to the invention.

What is claimed is:

1. A MEMS device comprising:
three mutually orthogonal axes being defined as an X-axis, a Y-axis, and a Z-axis;
a base;
a fixed electrode provided on the base;
a movable member facing the base along the Z-axis and supported by the base with a first gap therebetween; and
a wall spaced apart from the movable member along the Y-axis by a second gap in a plan view;
wherein the wall includes an abutment portion facing the movable member along the Y-axis,
in the plan view, an outer edge of the movable member facing the abutment portion is planar,
a hollow exists in the abutment portion,
the hollow includes a first hole and a second hole,
the first hole is arranged closer to the movable member than the second hole along the Y-axis in the plan view,
the abutment portion includes a narrow width portion between the movable member and the first hole in the plan view, and
a width along the Y-axis of the narrow width portion is narrower than a width along the Y-axis of the wall.

2. The MEMS device according to claim 1, wherein the narrow width portion includes an abutment surface facing the outer edge of the movable member.

3. The MEMS device according to claim 2, wherein the outer edge of the movable member facing the abutment surface is parallel to the abutment surface in the plan view.

4. The MEMS device according to claim 3, wherein the abutment portion is arranged to at least partially face a corner area of the movable member.

5. The MEMS device according to claim 3, wherein the wall includes a plurality of the abutment portions.

6. The MEMS device according to claim 3, wherein each of the first hole and the second hole is a through hole.

7. The MEMS device according to claim 3, wherein an opening of each of the first hole and the second hole is rectangular-shaped in the plan view.

8. The MEMS device according to claim 1, wherein the movable member and the abutment portion are made of the same material.

9. The MEMS device according to claim 1, wherein the abutment portion and the movable member are at a same potential.

10. The MEMS device according to claim 1, wherein the movable member includes a movable electrode facing the fixed electrode with a third gap therebetween.

11. An electronic apparatus comprising:
the MEMS device according to claim 1; and
a controller configured to control an object based on a detection signal output from the MEMS device.

12. A vehicle comprising:
the MEMS device according to claim 1; and
an attitude controller configured to perform attitude control based on a detection signal output from the MEMS device.

* * * * *